United States Patent [19]
Chappell et al.

[11] Patent Number: 5,942,917
[45] Date of Patent: Aug. 24, 1999

[54] HIGH SPEED RATIOED CMOS LOGIC STRUCTURES FOR A PULSED INPUT ENVIRONMENT

[75] Inventors: Barbara A. Chappell; Terry I. Chappell, both of Portland; Mark S. Milshtein, Hillsboro; Thomas D. Fletcher, Portland, all of Oreg.

[73] Assignee: Intel Corporation, Santa Clara, Calif.

[21] Appl. No.: 08/999,102

[22] Filed: Dec. 29, 1997

[51] Int. Cl.[6] .................. H03K 19/094; H03K 19/20
[52] U.S. Cl. .................. 326/121; 326/86; 326/98
[58] Field of Search .................. 326/121, 112, 326/119, 114, 30, 86, 17, 95, 98

[56] References Cited

U.S. PATENT DOCUMENTS

| | | | |
|---|---|---|---|
| 3,715,603 | 2/1973 | Lerch | 326/121 |
| 4,038,563 | 7/1977 | Zuleeg et al. | 326/112 |
| 5,073,726 | 12/1991 | Kato et al. | 326/30 |
| 5,532,620 | 7/1996 | Seo et al. | 326/17 |
| 5,550,490 | 8/1996 | Durham et al. | 326/98 |
| 5,592,103 | 1/1997 | Sutherland | 326/17 |
| 5,689,198 | 11/1997 | Merkel et al. | 326/121 |
| 5,828,234 | 10/1998 | Sprague | 326/17 |

*Primary Examiner*—Michael Tokar
*Assistant Examiner*—Daniel D. Chang
*Attorney, Agent, or Firm*—Ray J. Werner

[57] ABSTRACT

A logic structure adapted to receive pulsed active input signals produces a logical output with a very small inherent switching delay. Pull-down transistors and complementary pull-up transistors are ratioed such that the default logical output level remains close to nominal even when the logic structure sinks or sources a DC current. When the pulsed input signals are inactive, no DC current path is enabled.

20 Claims, 4 Drawing Sheets

HIGH SPEED RATIOED CMOS LOGIC STRUCTURES FOR A PULSED INPUT ENVIRONMENT

BACKGROUND OF THE INVENTION

1. Field of the Invention

The present invention relates generally to logic circuits, and more particularly to high speed CMOS circuit configurations for use with pulsed active inputs.

2. Background

Advances in semiconductor manufacturing technologies have allowed circuit designers to integrate tremendous numbers of transistors on a single die. For example, modern integrated circuits (ICs) commonly include several million transistors interconnected on a single, small substrate. Typically these are field effect transistors (FET). At the same time, computer architecture, and more particularly processor architecture, has gone in the direction of emphasizing shorter and shorter cycle times. These advances in semiconductor manufacturing and processor architecture have led designers to consider new ways of implementing basic circuit functions.

To produce IC's with shorter cycle times typically requires increasing the clock frequency at which these devices operate. Increasing clock frequencies means that fewer logic gate delays are permitted within each clock cycle. Yet modern processor acrrchitecture typically requires a significant amount of logical operations to take place as quickly as possible. As described below, several styles of logic design have been developed to achieve high speed operation.

Static full CMOS logic requires one p-channel field effect transistor (PFET) for each n-channel field effect transistor (NFET). For complex logic gates this means either an NFET stack with a PFET OR structure, or an NFET OR structure with a PFET stack. FIG. 1(a) shows the transistor level configuration of a static full CMOS complex logic gate. FIG. 1(b) shows a logic symbol representing the logical function implemented by the circuit of FIG. 1(a). The physical layout of these complex logic gate structures produces a substantial amount junction area, and thus parasitic capacitance, associated with the output node.

Dynamic logic structures, e.g., domino logic, have been developed which reduce the amount of parasitic capacitance at the output node relative to static full CMOS logic structures. Domino logic refers to a circuit arrangement in which there are several series coupled logic stages having precharged output nodes. An aggregation of several series coupled domino logic stages is referred to as a domino block. Alternatively, the domino block is referred to as a pipestage, since it is often used to implement pipelined architectures in high speed CMOS logic integrated circuits. The output node of an individual logic stage is precharged to a first logic level, logic signals are then applied such that, depending on the logic function being implemented and the state of the various input signals, the output node can be switched to a second logic level. As each domino stage in the chain evaluates, the output of the next domino stage may be enabled to switch. Since the precharged nodes "fall" in sequence, the operation has been analogized to falling dominoes, and hence the name for this type of circuit arrangement.

While domino circuits do tend to reduce both input capacitance and output capacitance as compared to static full CMOS logic structures, domino circuits require reset (i.e., precharge) circuitry, and further domino circuits are sensitive to charge sharing induced noise problems.

What is needed is a structure that provides high speed combinatorial logic functions, consumes a small amount of chip area, presents less input and output capacitance than static full CMOS logic structures, and is insensitive to charge sharing problems.

SUMMARY OF THE INVENTION

Briefly, a logic structure adapted to receive pulsed active input signals produces a logical output with a very small inherent switching delay. Pull-down transistors and complementary pull-up transistors are ratioed such that the default logical output level remains close to nominal even when the logic structure sinks or sources a DC current. When the pulsed input signals are inactive, no DC current path is enabled.

In one particular embodiment of the present invention, a logic structure having PFET pull-ups and NFET pull-downs, receives active low pulsed input signals and produces a logical high output signal when all the input signals are at a low level. When at least one, but not all, of the input signals are low, the logic structure produces a logical low output signal, while sinking a DC current. When all of the input signals are at a high level, which is the default condition for this particular embodiment, the logic structure produces a logical low output signal, and no DC current paths are switched on.

DETAILED DESCRIPTION

Figure 1A:
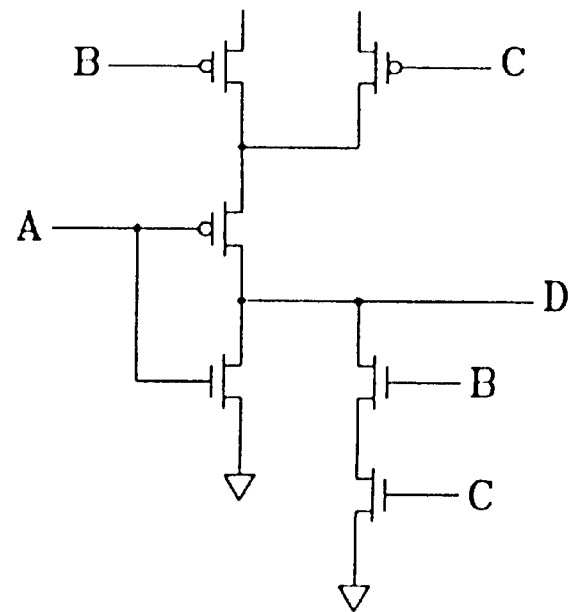
FIG. 1(a) shows the transistor level configuration of a static full CMOS complex logic gate.
Figure 1B:
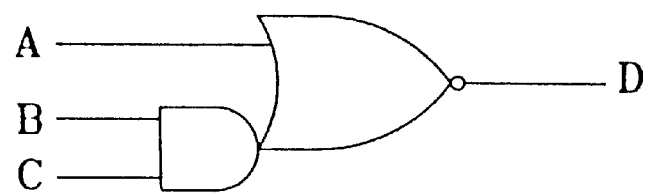
FIG. 1(b) shows a logic symbol representing the logical function implemented by the circuit of FIG. 1(a).

Illustrative embodiments of the present invention are described below. In the interest of clarity, not all aspects of an actual implementation are described in this specification. It will of course be appreciated that in the development of any such actual embodiment, numerous implementation-specific decisions must be made to achieve the developer's specific goals, such as compliance with system-related, and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Overview

Embodiments of the present invention provide area efficient, high speed circuits for achieving combinatorial logic with pulsed inputs. In one aspect of the present invention, symmetric logic structures have an equal number of pull-up pathways and pull-down pathways. In a further aspect of the present invention, asymmetric logic structures have an unequal number of pull-up pathways and pull-down pathways, with the number of pull-down pathways exceeding the number of pull-up pathways in a typical embodiment. These logic structures may also be referred to as logic gates.

Exemplary circuits in accordance with the present invention have a plurality of PFET and NFET pairs where the gates of each PFET and NFET pair are coupled in common to a signal source having an output signal that is normally in a logical high state, and having the ability to produce a pulsed low output state.

Logic structures in accordance with the present invention are particularly useful when used in conjunction with domino logic circuits. Pulsed domino circuits typically have outputs that default to a logical high state and generate low active, short pulses when the input signals controlling the domino evaluate path(s) enable conduction to ground. Those skilled in the art having the benefit of the teachings herein will recognize that domino structures having evaluate paths constructed with PFETs generally produce a high level output when the input signals controlling the PFET domino evaluate path(s) enable conduction to a positive voltage.

Terminology

The terms n-type domino, n-stack domino, and n-channel evaluate path, all refer to a domino stage in which the logical inputs to that domino stage control NFETs that create a path from the domino output node to ground. The terms p-type domino, p-stack domino, and p-channel evaluate path, all refer to a domino stage in which the logical inputs to that domino stage control PFETs that create a path from the output node to a positive voltage supply. Those skilled in the art will understand that domino circuit stages can be implemented with any suitable components and not only field effect transistors.

Evaluate, as used herein with respect to domino stages, refers to the domino output node going to an active state. This active state is a level different from the precharged state.

The term "gate" is context sensitive and can be used in two ways when describing integrated circuits. As used herein, gate refers to a circuit for realizing an arbitrary logical function when used in the context of a logic gate. Gate refers to the insulated gate terminal of a three terminal FET when used in the context of transistor circuit configuration. Although a FET can be viewed as a four terminal device when the semiconductor substrate is considered, for the purpose of describing illustrative embodiments of the present invention, the FET will be described using the traditional gate-drain-source, three terminal model.

Pulse refers to a signal that is asserted for a short duration. Typically, a pulse is asserted in conjunction with a transition in a clock signal, and deasserted independently of the clock signal. Moreover, the duration of the pulse, i.e., the length of time that the pulse is asserted, is generally short relative to a clock period.

Reset, in the field of digital circuit technology generally, refers to bringing an output node to a logical low, or zero. However, with respect to a domino logic stage, reset refers to bringing an output node to the "non-evaluate" state. That is, a domino stage having an n-channel evaluate path will reset to a high level, but a domino stage having a p-channel evaluate path will reset to a low level.

Self-resetting domino stages are sometimes referred to as having atomic reset circuits. Alternatively, self-resetting domino are sometimes referred to as self-terminating. All these terms refer to domino stages having circuits that initiate precharging of the domino stage output node, when the output node evaluates.

Zipper domino refers to a circuit configuration having a plurality of domino stages connected in series, where the domino stages are alternately n-channel evaluate path stages, and p-channel evaluate path stages.

Circuit Configuration

Since embodiments of the present invention are particularly useful in conjunction with domino type logic circuits, some basic information describing domino circuits is provided below with reference to FIGS. 2–3. Those skilled in the art will recognize that there are many circuit variations and modifications that can be made within the general category of domino circuit designs. After the brief description of exemplary domino logic circuits, specific embodiments of ratioed CMOS logic structures in accordance with the present invention are described.

Figure 2:
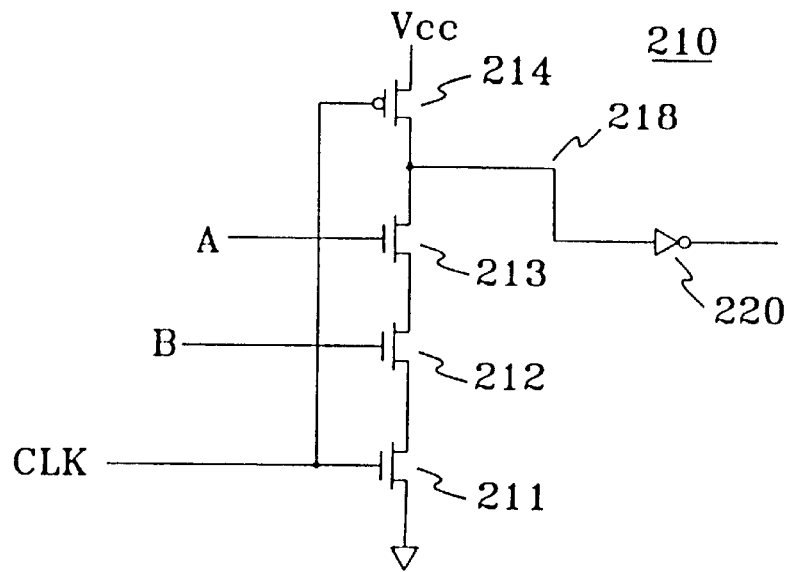
FIG. 2 is a schematic showing the circuit configuration of a basic domino logic stage.

FIG. 2 shows a conventional implementation of a 2-input NAND gate 210 in domino logic. NAND gate 210 comprises NFETs 211–213 coupled in series (i.e., an n-stack) between an output node 218 and ground, and a PFET 214 coupled between a voltage supply and output node 218. The gate of PFET 214 is coupled to the gate of NFET 211 and both gates receive input clock signal CLK. Data inputs B and A are shown coupled to the gates of NFETs 212 and 213 respectively. In operation, there are two phases, a precharge phase and evaluate phase. Alternative terms for these two phases are the precharge period and the evaluation period, respectively. In the precharge phase, output node 218 charges to a high level when CLK is low because NFET 211 is off, thus there is no conduction path to ground from output node 218 and at the same time PFET 214 is on, thus creating a conduction path from voltage supply Vcc to output node 218. For proper operation, signals A and B are expected to become stable prior to CLK going high. In the evaluate phase, CLK goes high thus turning off PFET 214 and turning on NFET 211. With NFET 211 turned on, there will be a conduction path from output node 218 to ground if both signals A and B are high. That is, if both NAND inputs are high, the output will go low during the evaluate phase, otherwise the output will remain high. Note that when output node 218 is not discharged through the n-stack during the evaluate phase, that output node 218 is "floating" high and its voltage will be subject to change due charge loss or gain though leakage currents and capacitive coupling to other signals. Output node 218 is coupled to the input of an inverter 220.

When domino stages are coupled in series, they are generally coupled by way of a static inverting logic stage such as inverter 220. Although zipper implementations of domino logic have been devised, it is more typical to have n-stack domino stages coupled in series by static inverting logic structures. This arrangement is useful because the n-stack domino output nodes are precharged to a high level, therefore being connected directly to an input of another n-stack domino stage could result in an erroneously discharged domino stage. Those skilled in the art will appreciate that inverting logic structures other than an inverter may be disposed between domino stages. For example, logical NAND and NOR functions can be used.

Figure 3:
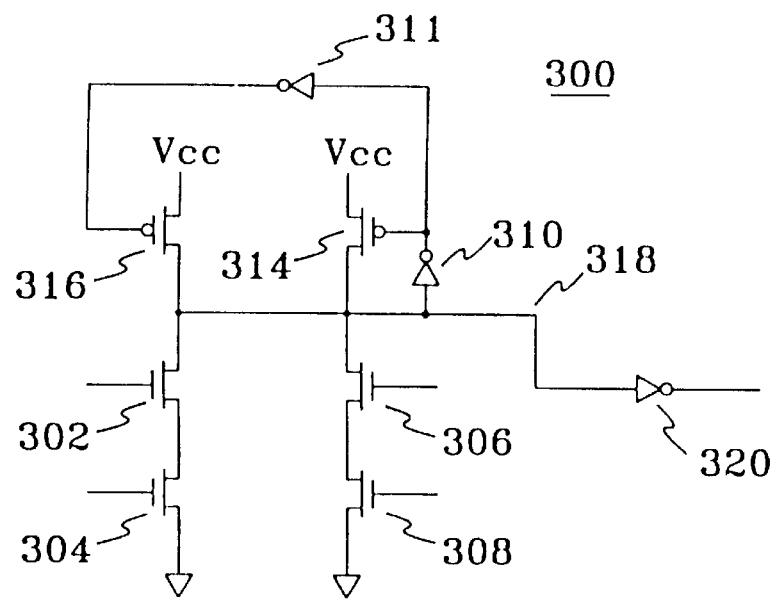
FIG. 3 is a schematic showing the circuit configuration of a domino logic stage having domino compatible inputs, a half-keeper, and a reset device.

FIG. 3 illustrates a domino logic stage 300 used to form a pipestage in an illustrative embodiment of the present invention. As will be understood by those skilled in the art, various logic functions can be implemented by variously configuring the NFETs coupled between domino output 318 and ground. In the example illustrated in FIG. 3, two parallel, two high AND stacks are used. A first AND stack is made by coupling NFETs 302, 304 in series between domino output 318 and ground as shown in FIG. 3. A second AND stack is made by coupling NFETs 306, 308 in series between domino output 318 and ground as shown in FIG. 3. Two PFETs 314, 316, are coupled in parallel between a power supply and domino output 318. PFET 316 is the reset device, and provides the charge needed to return domino output 318 from a low level to a high level. Domino output node 318 is coupled to an input of inverter 320. PFET 316 has a gate 312 that is coupled to a reset signal. In embodiments of the present invention at least one of the domino stages implements a self-resetting circuit, and at least one domino stage implements a self-tailored clocked reset. The half keeper function of domino logic stage 300 includes an inverter 310. The input of inverter 310 is coupled to domino output 318. The output of inverter 310 is coupled to the gate of PFET 314. Inverter 310 together with PFET 314 implement the half keeper function.

When domino output 318 is high, the output of inverter 310 goes low, and the low on the gate of PFET 314 turns on PFET 314 so that a conductive path between the power supply and domino output 318 exists. In this way, a high level is maintained at domino output 318 by the half-keeper. When domino output 318 evaluates low, the output of inverter 310 goes high, and consequently PFET 314 turns off.

When gate 312 of PFET 316 is at a high level, PFET 316 is turned off and no conductive path exists between the power supply and domino output 318. When gate 312 of PFET 316 is at a low level, PFET 316 is turned on and a conductive path exists between the power supply and domino output 318. In this way, domino output 318 is reset to a high level. As domino output 318 returns to a high level, the output of inverter 310 goes low, consequently PFET 314 turns on. Typically PFETs 314, 316, are sized such that PFET 314 has a greater on-resistance than PFET 316.

Figure 4A:
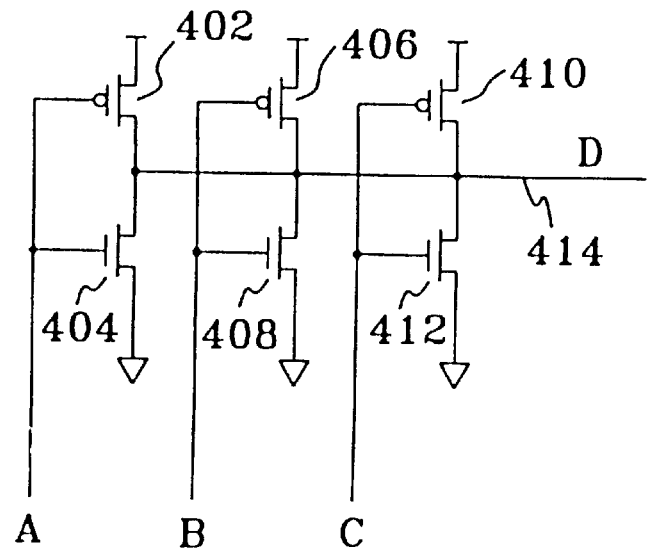
FIG. 4(a) is a schematic of a symmetric ratioed CMOS logic structure in accordance with the present invention.

Referring to FIG. 4(a), a three-input, symmetric, ratioed CMOS logic structure in accordance with the present invention is described. As shown in the figure, PFETs 402, 406, 410 are coupled source-to-drain between a first power supply node and an output node 414. In this way, PFETs 402, 406, 410 form switchable conductive paths between the first power supply node and output node 414. That is, a conductive path between node 414 and the first power supply node can be switched on and off by controlling the voltage applied to the gates of PFETs 402, 406, 410. NFETs 404, 408, 412 are coupled drain-to-source between output node 414 and a second power supply node. In this way, NFETs 404, 408, 412 form switchable conductive paths between output node 414 and the second power supply node. That is, a conductive path between node 414 and the second power supply node can be switched on and off by controlling the voltage applied to the gates of NFETs 404, 408, 412. Those skilled in the art, having the benefit of the teachings herein, will appreciate that although the switchable conductive paths illustrated herein show a single transistor between the output node and a first or second voltage supply node, these switchable conductive paths can be implemented with series connected circuit elements such as field effect transistors.

In a typical implementation, the first power supply node is a positive voltage supply and the second power supply node is ground. The gates of PFET 402 and NFET 404 are coupled in common to an active low, pulsed, signal source labelled A. The gates of PFET 406 and NFET 408 are coupled in common to an active low, pulsed, signal source labelled B. The gates of PFET 410 and NFET 412 are coupled in common to an active low, pulsed, signal source labelled C. Each of NFETs 404, 408, 412 are sized such that any one of them can sink the current provided by two of the PFETs that are fully conducting and maintain a predetermined nominal low level at output node 414.

Still referring to FIG. 4(a), it can be seen that when all the active low, pulsed input signals, A, B, and C, are in a high state, that output node 414 is coupled to ground through NFETs 404, 408, 412 and PFETs 402, 406, 410 are off, so there is no DC current path. Similarly, when all the active low, pulsed input signals, A, B, and C, are in a low state, output node 414 goes high quickly, because the path to ground through the NFETs has been turned off and all three PFETs 402, 406, 410 are turned on, in parallel, and driving output node 414 high. However, when one or two of the active low pulsed input signals go low and at least one of the active low pulsed input signals remains high, output node In 414 remains low, because the NFETs are sized to sink substantially all the current from the PFETs that are turned on. It is only during this condition that a DC current path exists. While typically DC current paths are avoided by designers in order to reduce the amount of power dissipated by an integrated circuit, the ratioed CMOS logic structure of the present invention is typically operated such that the active low pulses of the input signals have short time durations and therefore the DC current paths only exist for short times. The switching speed obtained from this logic structure is useful for high speed designs despite the extra power consumed as compared with full static CMOS structures.

Figure 4B:
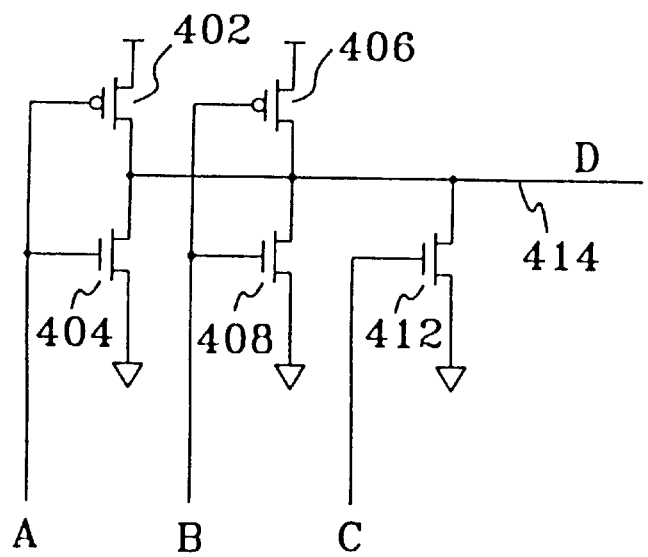
FIG. 4(b) is a schematic of an asymmetric ratioed CMOS logic structure in accordance with the present invention.

Referring to FIG. 4(b), a three-input, asymmetric, ratioed CMOS logic structure in accordance with the present invention is described. As shown in the figure, PFETs 402, 406, are coupled source-to-drain between a first power supply node and an output node 414. In this way, PFETs 402, 406, form switchable conductive paths between the first power supply node and output node 414. That is, a conductive path between node 414 and the first power supply node can be switched on and off by controlling the voltage applied to the gates of PFETs 402, 406. NFETs 404, 408, 412 are coupled drain-to-source between output node 414 and a second power supply node. In this way, NFETs 404, 408, 412 form switchable conductive paths between output node 414 and the second power supply node. That is, a conductive path between node 414 and the second power supply node can be switched on and off by controlling the voltage applied to the gates of NFETs 404, 408, 412. In a typical implementation, the first power supply node is a positive voltage supply and the second power supply node is ground. The gates of PFET 402 and NFET 404 are coupled in common to an active low, pulsed, signal source labelled A. The gates of PFET 406 and NFET 408 are coupled in common to an active low, pulsed, signal source labelled B. The gate of NFET 412 is coupled to an active low, pulsed, signal source labelled C. Each of NFETs 404, 408, 412 are sized such that any one of them, when switched on, can sink the current provided by the PFETs that are fully conducting, and still maintain a predetermined nominal lo low level at output node 414. The asymmetric implementation has less parasitic junction capacitance at its output node than the symmetric implementation.

Figure 5:
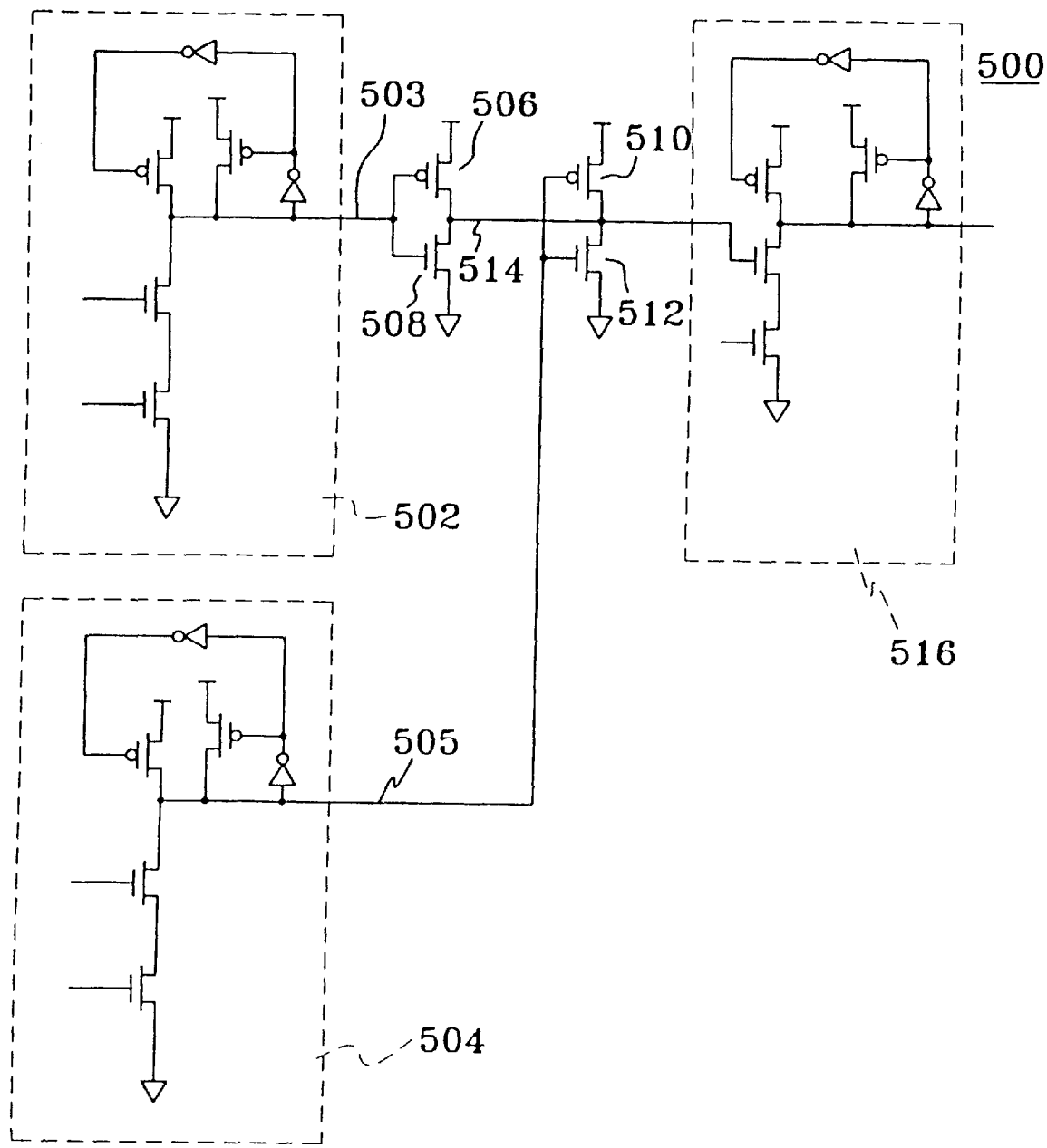
FIG. 5 is a schematic diagram showing an embodiment of the present invention including domino logic stages as the pulsed signal sources.

Referring to FIG. 5, an circuit embodiment 500 of the present invention is shown with self-resetting domino logic stages as the source of low active, pulsed output signals. As can been seen in FIG. 5, a self-resetting n-stack domino stage 502 produces a low active pulse at output node 503 when inputs signals A and B go high. Similarly, a self-resetting n-stack domino stage 504 produces a low active pulse at output node 505 when inputs signals C and D go high.

An exemplary ratioed CMOS logic structure includes a PFET 506, coupled source-to-drain between a positive voltage supply node and output node 514, an NFET 508, coupled drain-to-source between output node 514 and ground, a PFET 510, coupled between the positive supply voltage and output node 514, and an NFET 512 coupled drain-to-source between output node 514 and ground. The gates of PFET 506 and NFET 508 are coupled to output node 503 of domino logic stage 502. The gates of PFET 510 and NFET 512 are coupled to output node 505 of domino logic stage 504. NFET 508, is sized such that it can sink the current of a fully turned on PFET 510. Similarly, NFET 512, is sized such that it can sink the current of a fully turned on PFET 506.

The output signal produced at output node 514 by the ratioed CMOS logic structure shown in FIG. 5, is typically coupled to another domino logic stage 516 as shown in the figure. The output at node 514 is the logical AND of signals A, B, C, and D. Those skilled in the art, having the benefits of the teaching herein, will appreciated that other logical functions can be similarly implemented. Moreover, the ratioed CMOS logic structure shown in FIG. 5 is extensible such that, rather than the 4-way AND function illustrated, a 5-way, 6-way or more AND function can be realized. A particular advantage of the ratioed CMOS logic structure of the present invention is that stacks of NFETs or PFETs are not required. This reduces the input capacitance and the output capacitance of the structure relative to a conventional static full CMOS logic implementation.

Conclusion

Embodiments of the present invention provide, a family of logic structures adapted to receive pulsed active input signals and produce a logical output with a very small inherent switching delay. Pull-down transistors and complementary pull-up transistors are ratioed such that the default logical output level remains close to nominal even when the logic structure sinks or sources a DC current. When the pulsed input signals are inactive, no DC current path is enabled.

An advantage of embodiments of the present invention is that a CMOS logic structure is achieved without requiring stacked PFETs or stacked NFETs, so that both the input capacitance, and parasitic junction capacitance at the output node, are reduced relative to a static full CMOS logic structure.

A further advantage of embodiments of the present invention is that, unlike traditional ratioed logic, no DC current path is enabled when all the input signals are in their default high state.

The present invention may be implemented with various changes and substitutions to the illustrated embodiments. For example, the present invention may be implemented with more or fewer input terminals. Another alternative, is where the ratioed CMOS logic structure of the present invention is configured to operate with a default input of a logic low and a default logic high output level. In this configuration the PFETs would be sized to source sufficient current such that a logic high level is maintained when one or more, but not all, the input signals transition to a logic high level.

It will be readily understood by those skilled in the art that various other changes in the details, materials, and arrangements of the parts and steps which have been described and illustrated in order to explain the nature of this invention may be made without departing from the principles and scope of the invention as expressed in the subjoined Claims.

What is claimed is:

1. A circuit comprising:
   a first switchable conductive path between a first node and an output node;
   a second switchable conductive path between the output node and a second node; and
   a third switchable conductive path between the output node and the second node;
   wherein the first and the second switchable conductive paths are coupled to a first low active, pulsed signal source, the third switchable conductive path is coupled to a second low active, pulsed signal source, and the second and third switchable conductive paths each have an on-resistance which is substantially less than an on-resistance of the first switchable conductive path.

2. The circuit of claim 1, the first node is a positive voltage supply and the second node is ground.

3. The circuit of claim 1, the first switchable conductive path comprises at least one PFET.

4. The circuit of claim 1, the second switchable conductive path comprises at least one NFET.

5. A circuit comprising:
   a first ratioed CMOS inverter having an input terminal, and an output terminal coupled to an output node; and
   a second ratioed CMOS inverter having an input terminal, and an output terminal coupled to the output node;
   wherein the input terminal of the first ratioed CMOS inverter is coupled to an output node of a first, low active, pulsed signal source, and the input terminal of the second ratioed CMOS inverter is coupled to an output node of a second, low active, pulsed signal source.

6. The circuit of claim 5, wherein the first ratioed CMOS inverter comprises a first PFET coupled source-to-drain between a first node and the output terminal, and the first PFET having a gate coupled to the input terminal; a first NFET having a gate coupled to the input terminal, sized to have an on-resistance substantially less than an on-resistance of the first PFET, the first NFET coupled drain-to-source between the output terminal and a second node; and
   the second inverter comprises a second PFET coupled source-to-drain between the first node and the output terminal, and the second PFET having a gate coupled to the input terminal; a second NFET having a gate coupled to the input terminal, sized to have an on-resistance substantially less than an on-resistance of the second PFET, the second NFET coupled drain-to-source between the output terminal and the second node.

7. The circuit of claim 5, further comprising a third ratioed CMOS inverter having an input terminal and an output terminal, wherein the input terminal is coupled to the output node of a low active, pulsed signal source, and the output terminal is coupled to the output node.

8. The circuit of claim 5, further comprising a plurality of ratioed CMOS inverters, each having an input terminal coupled to respectively to a plurality of low active, pulsed signal sources, and the plurality of output terminals coupled in common to the output node.

9. The circuit of claim 6, further comprising an NFET coupled drain-to-source between the output node and the second node, the NFET having a gate coupled to a low active, pulsed signal source.

10. The circuit of claim 6, further comprising a plurality of NFETs, each coupled drain-to-source between the output node and the second node, and each NFET having a gate coupled to a low active, pulsed signal source.

11. The circuit of claim 6, wherein the first node is a positive voltage supply and the second node is ground.

12. The circuit of claim 9, wherein the low active, pulsed signal source is a domino logic stage.

13. The circuit of claim 10, wherein the low active, pulsed signal source is a domino logic stage.

14. A circuit comprising:
   a first PFET coupled source-to-drain between a first power supply node and an output node;
   a first NFET coupled drain-to-source between the output node and a second power supply node;
   a second PFET coupled source-to-drain between the first power supply node and the output node;
   a second NFET coupled drain-to-source between the output node and the second power supply node; and
   a third NFET coupled drain-to-source between the output node and the second power supply node;
   wherein a gate of the first PFET and a gate of the first NFET are coupled in common to a first input signal source, a gate of the second PFET and a gate of the second NFET are coupled in common to a second input signal source, a gate of the third NFET is coupled to a third input signal source and wherein no PFET having a gate coupled to the third input signal source is coupled to the output node;
   wherein the first, second and third input signal sources are active low, pulsed signals.

15. The circuit of claim 14, wherein the on-resistance of the first, second, and third NFETs is each substantially less than the on-resistance of each of the first and second PFETs.

16. The circuit of claim 14, wherein each PFET and each NFET has a width and a length, and the ratio of the width of any PFET to the width of any NFET is between approximately 2.5 and 3.0.

17. A circuit comprising:
   a ratioed asymmetric CMOS logic structure having a plurality of input terminals, and an output terminal; and
   a plurality of pulsed output domino logic stages, each having an output node;
   wherein each input terminal of the ratioed asymmetric CMOS logic structure is coupled to a corresponding output node of one of the plurality of pulsed output domino logic stages.

18. The circuit of claim 17, wherein the ratioed asymmetric CMOS logic structure comprises a number of NFETs and a number of PFETs, and the number of NFETs is greater than the number of PFETs.

19. The circuit of claim 17, wherein the ratioed asymmetric CMOS logic structure comprises a first number of logically unique switchable paths from an output node to a first node, and a second number of logically unique switchable paths from an output node to a second node, and first number and the second number are different.

20. The circuit of claim 19, wherein the switchable paths comprise transistors.

* * * * *